(12) United States Patent
Lin et al.

(10) Patent No.: US 8,040,167 B1
(45) Date of Patent: Oct. 18, 2011

(54) METHOD AND APPARATUS FOR CHARGE LEAKAGE COMPENSATION FOR CHARGE PUMP

(75) Inventors: Chia-Liang Lin, Fremont, CA (US); Gerchih Chou, San Jose, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 12/732,211

(22) Filed: Mar. 26, 2010

(51) Int. Cl.
*H03L 7/00* (2006.01)
(52) U.S. Cl. ........................................ 327/148; 327/157
(58) Field of Classification Search .................... None
See application file for complete search history.

(56) References Cited

U.S. PATENT DOCUMENTS

| | | | |
|---|---|---|---|
| 5,736,880 A * | 4/1998 | Bruccoleri et al. | 327/157 |
| 7,701,271 B1 * | 4/2010 | Sanielevici et al. | 327/157 |
| 2001/0052807 A1 * | 12/2001 | Vaucher | 327/157 |
| 2003/0107420 A1 * | 6/2003 | Hsu et al. | 327/157 |
| 2008/0068058 A1 * | 3/2008 | Kim et al. | 327/157 |
| 2009/0189654 A1 * | 7/2009 | Clements et al. | 327/157 |
| 2009/0243671 A1 * | 10/2009 | Draxelmayr | 327/157 |

* cited by examiner

*Primary Examiner* — Tuan T Lam
(74) *Attorney, Agent, or Firm* — Thomas, Kayden, Horstemeyer & Risley, LLP

(57) ABSTRACT

An apparatus is disclosed, the apparatus comprising: a charge pump for receiving a phase signal representing a result of a phase detection and for outputting a current flowing between an internal node and an output node; a capacitive load shunt at the output node; a current source controlled by a bias voltage for outputting a compensation current to the internal node; a current sensor inserted between the internal node and the output node for sensing the current; and a feedback network for adjusting the bias voltage in accordance with an output of the current sensor.

21 Claims, 1 Drawing Sheet

METHOD AND APPARATUS FOR CHARGE LEAKAGE COMPENSATION FOR CHARGE PUMP

FIELD OF TECHNOLOGY

This disclosure relates generally to method and apparatus of charge pump circuit.

BACKGROUND

A phase lock loop (PLL) is an important apparatus for numerous applications. A PLL receives a reference clock and generates accordingly an output clock that is phase locked with the reference clock. A phase lock loop typically comprises a controller and a controlled oscillator. The controlled oscillator outputs an output clock with a frequency controlled by a control signal generated by the controller. The output clock is usually divided down by a factor of N, where N is an integer, resulting in a divided-down clock. The controller issues the control signal based on detecting a phase difference between a reference clock and the divided-down clock. The frequency of the output clock is thus controlled in a closed-loop manner so as to minimize a phase difference between the reference clock and the divided-down clock. In a steady state, the output clock is thus phase locked with the reference clock.

In a typical PLL, the controller comprises a phase detector and a filter. The phase detector receives the reference clock and the divided-down clock and outputs a detector output signal representing a phase difference between the reference clock and the divided-down clock. The filter receives and converts the detector output signal into the control signal to control the controlled oscillator. In a typical PLL, the phase detector comprises a PFD (phase/frequency detector) and a charge pump circuit, and the resultant detector output signal is a current-mode signal. The filter serves as a capacitive load for the charge pump circuit, and effectively filters and converts the current-mode detector output signal into a voltage-mode control signal to control the oscillator, which is a voltage-controlled oscillator (VCO). Modern phase lock loops are usually implemented in a CMOS (complementary metal-oxide semiconductor) integrated circuit. In a deep submicron CMOS integrated circuit, high-speed devices of short channel lengths are prone to charge leakage. In particular, the charge pump circuit is prone to charge leakage due to using leaky MOS transistors. The charge leakage at the charge pump effectively introduces an error in the phase detection, which results in an error in the voltage-mode control signal and thus an error in the phase/frequency of the output clock. The error in the phase/frequency of the output clock is generally referred to as clock jitter.

What is needed is a method and apparatus to reduce the clock jitter due to charge leakage of the charge pump.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

In an embodiment, an apparatus is disclosed, the apparatus comprising: a charge pump for receiving a phase signal representing a result of a phase detection and for outputting a current flowing between an internal node and an output node; a capacitive load shunt at the output node; a current source controlled by a bias voltage for outputting a compensation current to the internal node; a current sensor inserted between the internal node and the output node for sensing the current; and a feedback network for adjusting the bias voltage in accordance with an output of the current sensor when the phase signal is in an inactive state.

In an embodiment a method is disclosed, the method comprising: receiving a phase signal representing a result of a phase detection; converting the phase signal into a raw current signal using a charge pump; generating a fine current signal by summing the raw current signal with a variable compensating current; transmitting the fine current signal into a capacitive load; detecting the fine current signal using a current sensor; and adapting the variable compensating current using a feedback network in accordance with an output of the current sensor when the phase signal is in an inactive state.

Figure 1A:
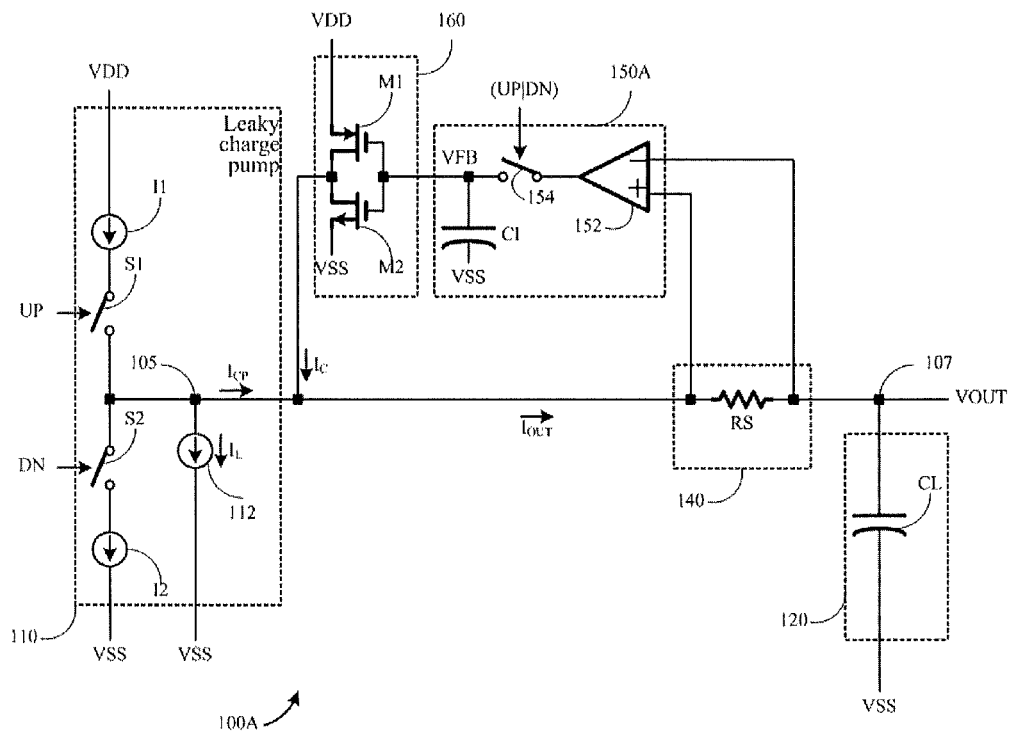
FIG. 1A shows a schematic diagram of a circuit in accordance with the present invention.

FIG. 1A shows a schematic diagram of a circuit 100A in accordance with this present invention. Circuit 100A comprises: a (leaky) charge pump 110 for receiving a phase signal (comprising a first logical signal UP and a second logical signal DN) and outputting a current signal $I_{CP}$ at an internal node 105; a substantially leakage-free capacitive load 120 comprising a capacitor CL for receiving a current signal $I_{OUT}$ and converting the current signal $I_{OUT}$ into an output voltage VOUT at an output node 107; a current sensor 140 embodied by a resistor RS inserted between the internal node 105 and the output node 107 for sensing the current signal $I_{OUT}$; a variable current source 160 embodied by a CMOS transistor pair M1-M2 controlled by a feedback voltage VFB for injecting a compensation current $I_C$ into the internal node 105; and a feedback network 150 embodied by an operational amplifier 152 loaded with an integrating capacitor CI via a switch 154 (which is closed if and only if ~(UP|DN) is true, i.e. neither UP or DN is asserted) for generating the bias voltage VFB. Here, VDD denotes a first substantially fixed-potential node (usually at an output of a power supply), and VSS denotes a second substantially fixed-potential node (usually referred to as "ground"). Just for illustration purpose, FIG. 1A further includes a fictitious current source 112 at the internal node 105 serving as an illustrative equivalent circuit to model the phenomenon of the charge leakage of the leaky charge pump 110. The principle of this present invention is explained as follows.

In a typical application to a phase lock loop, circuit 100A receives the phase signal (comprising the two logical signals UP and DN) as a timing detection result from a preceding phase detector (not shown in the figure), and outputs the output voltage VOUT for controlling a succeeding voltage controlled oscillator (not shown in the figure). A timing of an output clock of the voltage controlled oscillator is detected by comparing it with a reference timing (usually provided by a crystal oscillator) by the preceding phase detector. When a frequency of an output clock of the voltage controlled oscillator is too high, a timing of the output clock is often too early; this causes the second logical signal DN to be asserted more frequently, resulting in a decrease in the output voltage VOUT to decrease the frequency of the output clock. When the frequency of the output clock of the voltage controlled oscillator is too low, the timing of the output clock is often too late; this causes the first logical signal UP to be asserted more frequently, resulting in an increase in the output voltage VOUT to increase the frequency of the output clock. In this closed-loop manner, the output voltage VOUT is adjusted and settled into a value such that the frequency of the output clock is neither too high nor too low but just right. In the steady state, the output voltage VOUT must be settled, and therefore the following condition must be met:

$$<I_{out}>=0 \quad (1)$$

Here, $<\bullet>$ denotes a statistical mean. Equation (1) states that the mean net current following into the output node 107 must be zero, otherwise the output voltage VOUT cannot be settled. Also, the phase lock loop corrects the timing of the output clock by asserting UP and/or DN signal. When neither UP nor DN is asserted, one would like the output current $I_{OUT}$ to be zero, less it will lead to unintended change of the timing of the output clock, that is:

$$I_{OUT}=0 \text{ when neither UP nor DN is asserted} \quad (2)$$

Due to the leakage current $I_L$ of the leaky charge pump 110, however, there is a constant current at the internal node 105 even though neither UP nor DN is asserted. The compensation current $I_C$ is used to offset the leakage current $I_L$. Ideally, one would like the compensation current $I_c$ to be exactly the same as the leakage current $I_L$; in this case, the output current $I_{OUT}$ will be zero when neither UP nor DN is asserted. If the compensation current $I_C$ is smaller than the leakage current $I_L$, then the instantaneous value of the output current $I_{OUT}$ will be negative when neither UP nor DN is asserted; this causes the current sensor 140 to detect a negative current and consequently lowers the feedback voltage VFB to increase the compensation current $I_L$. If the compensation current $I_C$ is larger than the leakage current $I_L$, then the instantaneous value of the output current $I_{OUT}$ will be positive when neither UP nor DN is asserted; this causes the current sensor 140 to detect a positive current and consequently elevates the feedback voltage VFB to decrease the compensation current $I_C$. In this closed-loop manner, the compensation current $I_C$ is adjusted so as to perfectly offset the leakage current $I_L$ so that the instantaneous value of the output current $I_{OUT}$ will be zero when neither UP nor DN is asserted.

Figure 1B:
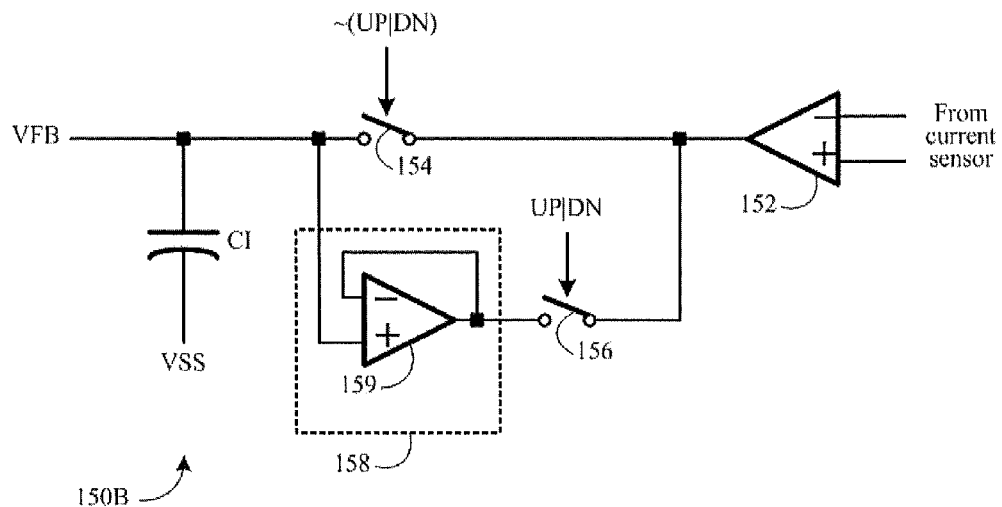
FIG. 1B shows a schematic diagram of a feedback network suitable for an alternative embodiment for the circuit of FIG. 1A.

In embodiment 100A, the feedback network 150A adjusts the feedback voltage VOUT only when neither UP nor DN is asserted (i.e., ~(UP|DN) is asserted). The integrating capacitor CI must be sufficiently large so that the feedback voltage VFB remains steady when either UP or DN is asserted and also the compensation loop adapts much slower than the phase lock loop (otherwise an instability might occur). When either UP or DN is asserted, however, the output of the operational amplifier 152 is virtually floating. This may not be desirable. To avoid this situation, an alternative embodiment 150B as depicted in FIG. 1B can be used. Embodiment 150B includes a voltage follower 158 comprising an operational amplifier 159 configured in a non-inverting feedback topology and an additional switch 156 that is turned on when either UP or DN is asserted (i.3. UP|DN). This causes the output of the operational amplifier 152 to be parked at VFB when either UP or DN is asserted.

In an alternative embodiment not shown in FIG. 1A, the capacitive load 120 comprises a serial connection of a resistor and a capacitor.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus comprising:
   a charge pump for receiving a phase signal representing a result of a phase detection and for outputting a current flowing between an internal node and an output node;
   a capacitive load shunt at the output node;
   a current source controlled by a bias voltage for outputting a compensation current to the internal node;
   a current sensor inserted between the internal node and the output node for sensing the current; and
   a feedback network for adjusting the bias voltage in accordance with an output of the current sensor.

2. The apparatus of claim 1, wherein the feedback network adjusts the bias voltage in accordance with an output of the current sensor when the phase signal is in an inactive state.

3. The apparatus of claim 1, wherein the phase signal comprises a first logical signal and a second logical signal, and the phase signal is in the inactive state when neither the first logical signal nor the second logical signal is asserted.

4. The apparatus of claim 1, wherein the current sensor comprises a resistor.

5. The apparatus of claim 4, wherein the output of the current sensor is a voltage difference between a first terminal and a second terminal of the resistor.

6. The apparatus of claim 1, wherein the feedback network comprises an amplifier for amplifying the output of the current sensor.

7. The apparatus of claim 6, wherein an output of the amplifier is coupled to an integrating capacitor via a first switch, the capacitor holding the feedback voltage, the first switch being turned on when the phase signal is in the inactive state.

8. The apparatus of claim 7, wherein the feedback network further comprises a voltage follower for tracking the bias voltage and an output of the voltage follower is coupled to the output of the amplifier via a second switch, the second switch being turned on when the phase signal is not in the inactive state.

9. The apparatus of claim 8, wherein a voltage associated with the capacitive load is used for controlling a timing of a timing device, and the phase signal represents a detection of the timing of the timing device.

10. A method comprising:
    receiving a phase signal representing a result of a phase detection;
    converting the phase signal into a raw current signal using a charge pump;
    generating a fine current signal by summing the raw current signal with a variable compensating current;
    transmitting the fine current signal into a capacitive load;
    detecting the fine current signal using a current sensor; and
    adapting the variable compensating current using a feedback network in accordance with an output of the current sensor.

11. The method of claim 10, wherein the variable compensating current is adapted in accordance with an output of the current sensor when the phase signal is in an inactive state.

12. The method of claim 10, wherein the phase signal comprises a first logical signal and a second logical signal, and the phase signal is in the inactive state when neither the first logical signal nor the second logical signal is asserted.

13. The method of claim 10, wherein the current sensor comprises a resistor.

14. The method of claim 13, wherein the output of the current sensor is a voltage difference between a first terminal and a second terminal of the resistor.

15. The method of claim 10, wherein the feedback network comprises an amplifier for amplifying the output of the current sensor.

16. The method of claim 15, wherein an output of the amplifier is coupled to an integrating capacitor via a first switch, the capacitor holding the feedback voltage, the first switch being turned on when the phase signal is in the inactive state.

17. The method of claim 16, wherein the feedback network further comprises a voltage follower for tracking the bias voltage and an output of the voltage follower is coupled to the output of the amplifier via a second switch, the second switch being turned on when the phase signal is not in the inactive state.

18. The method of claim 17, wherein a voltage associated with the capacitive load is used for controlling a timing of a timing device, and the phase signal represents a detection of the timing of the timing device.

19. An apparatus comprising:
a charge pump for receiving a phase signal representing a result of a phase detection and for outputting a current flowing between an internal node and an output node;
a capacitive load shunt at the output node;
a current sensor inserted between the internal node and the output node for sensing the current; and
a compensating current generator controlled by an output of the current sensor for outputting a compensation current to the internal node.

20. The apparatus of claim 19, wherein the compensating current generator further comprises:
a current source for providing the compensation current to the internal node; and
a control circuit for adjusting the compensation current of the current source according to the output of the current sensor.

21. The method of claim 10, wherein the current sensor is coupled between the charge pump and the capacitive load.

* * * * *